(12) United States Patent
He

(10) Patent No.: US 11,474,572 B2
(45) Date of Patent: Oct. 18, 2022

(54) SIGNAL TRANSMISSION APPARATUS AND DISPLAY APPARATUS

(71) Applicant: HKC CORPORATION LIMITED, Shenzen (CN)

(72) Inventor: Huailiang He, Shenzen (CN)

(73) Assignee: HKC CORPORATION LIMITED, Shenzen (CN)

( * ) Notice: Subject to any disclaimer, the term of this patent is extended or adjusted under 35 U.S.C. 154(b) by 97 days.

(21) Appl. No.: 16/759,724

(22) PCT Filed: Nov. 15, 2017

(86) PCT No.: PCT/CN2017/111208
§ 371 (c)(1),
(2) Date: Apr. 27, 2020

(87) PCT Pub. No.: WO2019/080210
PCT Pub. Date: May 2, 2019

(65) Prior Publication Data
US 2021/0181811 A1     Jun. 17, 2021

(30) Foreign Application Priority Data
Oct. 26, 2017    (CN) .................. 201711016073.X

(51) Int. Cl.
*G06F 1/18*      (2006.01)
*G06F 3/041*     (2006.01)
(Continued)

(52) U.S. Cl.
CPC .......... *G06F 1/183* (2013.01); *G06F 3/04164* (2019.05); *H05K 1/181* (2013.01);
(Continued)

(58) Field of Classification Search
CPC .. H05K 1/18; H05K 1/47; H05K 1/89; H05K 1/181–187; H05K 3/33–34;
(Continued)

(56) References Cited

U.S. PATENT DOCUMENTS 9,474,154 B2 * 10/2016 Johansson .............. H05K 1/111
9,710,084 B2 * 7/2017 Kim ....................... G06F 3/0412
(Continued)

FOREIGN PATENT DOCUMENTS

CN        1570717 A     1/2005
CN    101452128 A     6/2009
(Continued)

OTHER PUBLICATIONS

International Search Report issued for the corresponding international application No. PCT/CN2017/111208, dated Aug. 1, 2018, 4 pages (English Translation).

*Primary Examiner* — Tuan T Dinh
(74) *Attorney, Agent, or Firm* — Snyder, Clark, Lesch & Chung, LLP

(57) ABSTRACT

The present disclosure illustrates a signal transmission apparatus and a display apparatus using the same. The signal transmission apparatus comprises a first flexible printed circuit board electrically connected to a display module and a system, and comprising a port; and a second flexible printed circuit board electrically connected to the display module, and comprising a port connection member, and the port connection member corresponding to the port. The second flexible printed circuit board is electrically connected to the first flexible printed circuit board through the port connection member and the port, and is further electrically connected to the system. The signal transmission apparatus is used to replace the conventional manner of soldering multiple circuit boards for connection, so as to prevent the variation during the soldering process, and reduce errors of (Continued)

the manufacturing process, and improve yield rate of the display product. Furthermore, compared with the soldering manner, the signal transmission apparatus of the present disclosure improves connection strength between multiple circuit boards.

18 Claims, 7 Drawing Sheets

(51) Int. Cl.
H05K 1/18 (2006.01)
H05K 3/34 (2006.01)
G02F 1/1333 (2006.01)

(52) U.S. Cl.
CPC ........ *H05K 3/3431* (2013.01); *G02F 1/13338* (2013.01); *H05K 2201/10128* (2013.01); *H05K 2201/10151* (2013.01); *H05K 2203/048* (2013.01)

(58) Field of Classification Search
CPC ........ H05K 3/3431; H05K 2201/10128; G06F 1/83; G06F 1/637–643; G02F 1/13; G02F 1/13452
USPC ................ 361/749, 760–764, 782–784, 775; 174/250–260; 349/149–151
See application file for complete search history.

(56) References Cited

U.S. PATENT DOCUMENTS

| | | | |
|---|---|---|---|
| 2005/0233611 A1* | 10/2005 | Sung | G02F 1/13452 439/67 |
| 2006/0027909 A1* | 2/2006 | Kobayashi | H05K 3/361 257/688 |
| 2012/0168948 A1* | 7/2012 | Rathburn | H01L 23/49822 257/737 |
| 2012/0314383 A1* | 12/2012 | Oohira | G02F 1/13452 361/749 |
| 2015/0162388 A1* | 6/2015 | Kim | G02F 1/13338 257/40 |
| 2016/0198560 A1* | 7/2016 | Shin | H05K 1/147 361/749 |
| 2017/0148702 A1* | 5/2017 | Funayama | G06F 3/0445 |
| 2017/0271799 A1* | 9/2017 | Axelowitz | G06F 1/1613 |
| 2018/0184523 A1* | 6/2018 | Yoo | H05K 1/18 |

FOREIGN PATENT DOCUMENTS

| | | |
|---|---|---|
| CN | 106526925 A | 3/2017 |
| CN | 106876347 A | 6/2017 |
| KR | 20070068123 A | 6/2007 |

* cited by examiner

SIGNAL TRANSMISSION APPARATUS AND DISPLAY APPARATUS

CROSS-REFERENCE TO RELATED APPLICATION

This application, filed under 35 USC 371, claims the benefit of PCT/CN2017/111208, filed Nov. 15, 2017, which claims the benefit of and priority to China Patent Application No. 201711016073.X, filed on Oct. 26, 2017, in the State Intellectual Property Office of the People's Republic of China, the disclosures of which are incorporated in their entirety by reference.

BACKGROUND OF THE INVENTION

1. Field of the Invention

The present disclosure relates to a signal transmission apparatus, and more particularly to a signal transmission apparatus including a plurality of printed circuit boards, and a display apparatus using the signal transmission apparatus.

2. Description of the Related Art

In general, a liquid crystal display apparatus with a touch control function (hereafter refer to as a touch control liquid crystal apparatus) includes a system, a LCD panel, a touch panel and a light source. In a structure of a typical touch control liquid crystal apparatus, the signals of the LCD panel, the touch panel and the light source are transmitted through different flexible printed circuit boards. However, in order to transmit the signals to the system through the flexible printed circuit boards, the signals must be through three ports electrically connected to the system, so that the system must have larger space for the plurality of ports, and reduction of the size of the apparatus is limited.

Furthermore, in prior art, the soldering manner is used to solder and electrically connect the plurality of flexible printed circuit boards to the same flexible printed circuit board, so as to collect the signals first and transmit the collected signal to the system. As a result, the system just needs to have the space for one port, thereby solving above problem.

However, the soldering process may have variation, for example, the mechanical soldering process may be affected by environmental factor easily, and the manual soldering process is hard to control the soldering quality. Therefore, what is needed is to develop a signal transmission apparatus to solve above problems.

SUMMARY OF THE INVENTION

An objective of the present disclosure is to provide a signal transmission apparatus, to solve the problem of limitation in size reduction of the apparatus and variation during the soldering process.

An objective of the present disclosure is to provide a display apparatus, to solve the problem of limitation in size reduction of the apparatus and variation during the soldering process.

According to an embodiment, the present disclosure provides a signal transmission apparatus comprising: a first flexible printed circuit board electrically connected to a display module and a system, and comprising a port; and a second flexible printed circuit board electrically connected to the display module, and comprising a port connection member, wherein the port connection member corresponds to the port; wherein the second flexible printed circuit board is electrically connected to the first flexible printed circuit board through the port connection member and the port, and is further electrically connected to the system.

Preferably, the second flexible printed circuit board is configured to transmit a light source signal.

Preferably, the second flexible printed circuit board is configured to transmit a touch control signal.

Preferably, the second flexible printed circuit board is configured to transmit a light source signal and a touch control signal.

Preferably, the first flexible printed circuit board and the second flexible printed circuit board are fixed relative to each other through an alignment mark.

Preferably, the signal transmission apparatus further comprises a third flexible printed circuit board.

Preferably, the first flexible printed circuit board and the third flexible printed circuit board are fixed relative to each other through an alignment mark.

Preferably, the first flexible printed circuit board and the second flexible printed circuit board are fixed relative to each other through an alignment mark, and the first flexible printed circuit board and the third flexible printed circuit board are fixed relative to each other through other alignment mark.

According to an embodiment, the present disclosure provides a display apparatus comprising a display module; and a system. The display module and the system are electrically connected to each other through a signal transmission apparatus, and the signal transmission apparatus comprises: a first flexible printed circuit board electrically connected to a display module and a system, and comprising a port; and a second flexible printed circuit board electrically connected to the display module, and comprising a port connection member, wherein the port connection member corresponds to the port; wherein the second flexible printed circuit board is electrically connected to the first flexible printed circuit board through the port connection member and the port, and is further electrically connected to the system.

Preferably, the second flexible printed circuit board is configured to transmit a light source signal.

Preferably, the second flexible printed circuit board is configured to transmit a touch control signal.

Preferably, the second flexible printed circuit board is configured to transmit a light source signal and a touch control signal.

Preferably, the first flexible printed circuit board and the second flexible printed circuit board are fixed relative to each other through an alignment mark.

Preferably, the display apparatus further comprises a third flexible printed circuit board.

Preferably, the first flexible printed circuit board and the third flexible printed circuit board are fixed relative to each other through an alignment mark.

Preferably, the first flexible printed circuit board and the second flexible printed circuit board are fixed relative to each other through an alignment mark, and the first flexible printed circuit board and the third flexible printed circuit board are fixed relative to each other through other alignment mark.

According to an embodiment, the present disclosure provides a signal transmission apparatus comprising: an insulation substrate; a connection member disposed on the insulation substrate and electrically connected to the system; a first conductive pattern disposed on the insulation substrate, and electrically connected to the display module and the connection member; a second conductive pattern disposed on the first conductive pattern, and electrically connected to the display module and the first conductive pattern; a third conductive pattern disposed on the second conductive pattern, and electrically connected to the display module and the second conductive pattern; insulation layers disposed between the first conductive pattern, the second conductive pattern and the third conductive pattern, respectively, and configured to insulate and attach the first conductive pattern, the second conductive pattern and the third conductive pattern; an interlayer conduction structure disposed in the insulation layers, wherein the second conductive pattern and the third conductive pattern are electrically connected to the system through the first conductive pattern through the interlayer conduction structure.

Optionally, the interlayer conduction structure comprises through hole formed in the insulation layer in vertical direction.

Optionally, an inner wall of the through hole is coated with conductive layer.

Optionally, the insulating layer and the first conductive pattern and the second conductive pattern are attached with each other by solidifying prepolymer solution.

According to an embodiment, the present disclosure provides a manufacturing method of a signal transmission apparatus, and the methods comprises steps of disposing an insulation substrate; disposing a connection member on the insulation substrate, and electrically connecting the connection member and a system; disposing a first conductive pattern on the insulation substrate, and electrically connecting the first conductive pattern and the display module and the connection member; disposing a second conductive pattern on the first conductive pattern, and electrically connecting the second conductive pattern, the display module and the first conductive pattern; disposing a third conductive pattern on the second conductive pattern, and electrically connecting the third conductive pattern, the display module and the second conductive pattern; disposing an insulating layers between the first conductive pattern, the second conductive pattern and the third conductive pattern, to insulating and attaching the first conductive pattern, the second conductive pattern and the third conductive pattern; and disposing an interlayer conduction structure, wherein the interlayer conduction structure comprises: disposing through holes on the insulating layer in a vertical direction; and coating conductive layers on inner walls of the through holes; wherein the conductive layers are electrically connected to at least one of the first conductive pattern, the second conductive pattern and the third conductive pattern, so that the second conductive pattern and the third conductive pattern are electrically connected to the system through the first conductive pattern.

According to an embodiment, the present disclosure provides a display apparatus comprising: a display module; and a system. The display module and the system are electrically connected to each other through a signal transmission apparatus, and the signal transmission apparatus comprises: a first flexible printed circuit board electrically connected to a display module and a system, and comprising a port; and a second flexible printed circuit board electrically connected to the display module, and comprising a port connection member corresponding to the port, and electrically connected to the first flexible printed circuit board through the port connection member and the port; a third flexible printed circuit board electrically connected to the display module, and comprising at least one other port connection member; wherein the second flexible printed circuit board is configured to transmit a light source signal, a touch control signal or both, and the first flexible printed circuit board and the second flexible printed circuit board are fixed relative to each other through an alignment mark, and the first flexible printed circuit board and the third flexible printed circuit board are fixed relative to each other through other alignment mark.

The present disclosure provides the signal transmission apparatus to replace the conventional manner of soldering multiple circuit boards for connection, so as to prevent the variation during the soldering process, and reduce errors of the manufacturing process, and improve yield rate of the display product. Furthermore, compared with the soldering manner, the signal transmission apparatus of the present disclosure can improve connection strength between multiple circuit boards.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
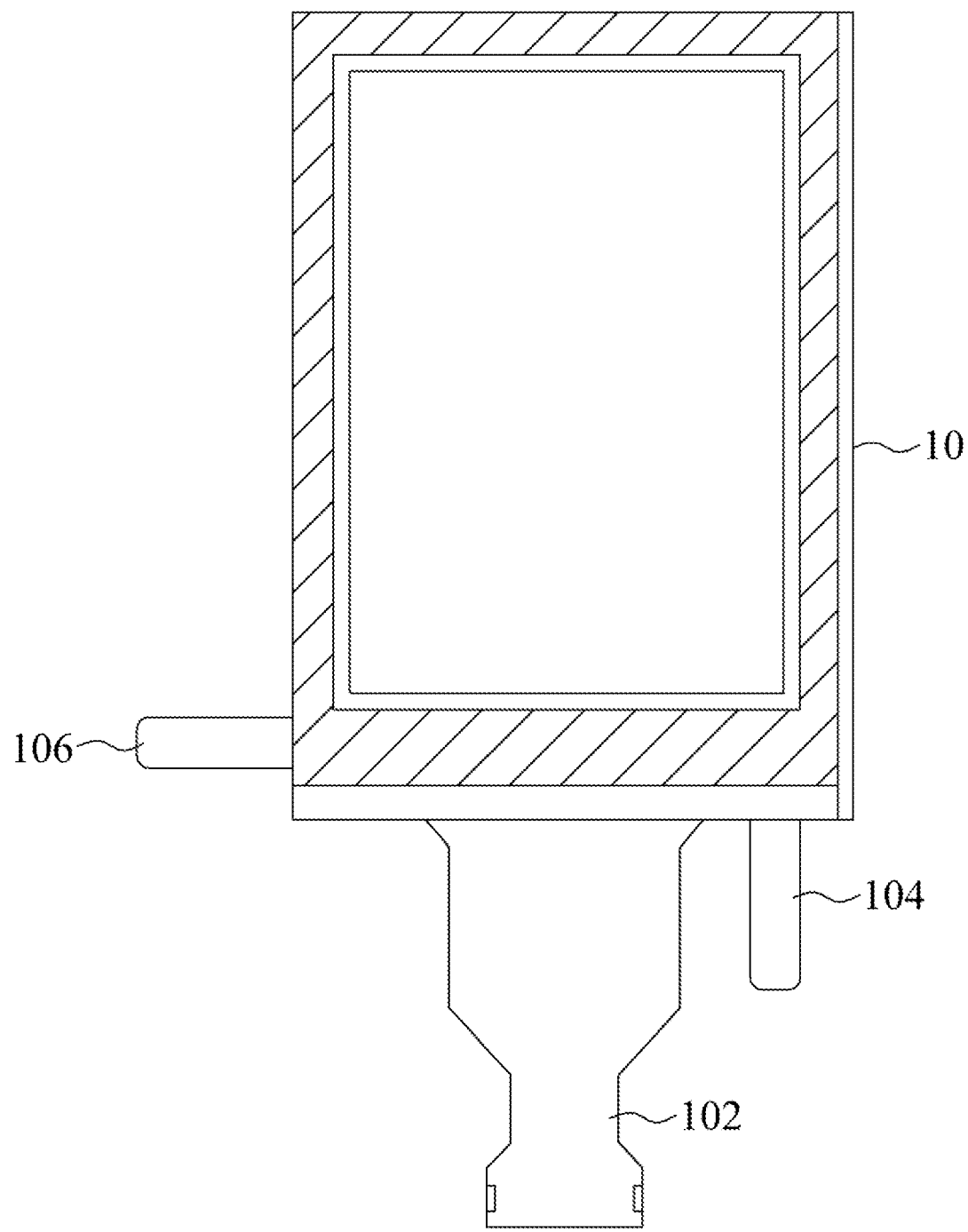
FIG. 1 is a schematic structural view of an example of a liquid crystal touch control apparatus.

The following embodiments of the present disclosure are herein described in detail with reference to the accompanying drawings. These drawings show specific examples of the embodiments of the present disclosure. It is to be understood that these embodiments are exemplary implementations and are not to be construed as limiting the scope of the present disclosure in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

As shown in FIG. 1, the signals of a touch panel, a light source, and a LCD panel are transmitted through the flexible printed circuit boards 102, 104 and 106 in the display module 10. However, when the signals are transmitted through the flexible printed circuit boards and the flexible printed circuit boards are electrically connected to three ports respectively, it means that the system must has a larger space for the plurality of ports, and reduction of the size of the apparatus is limited.

Figure 2:
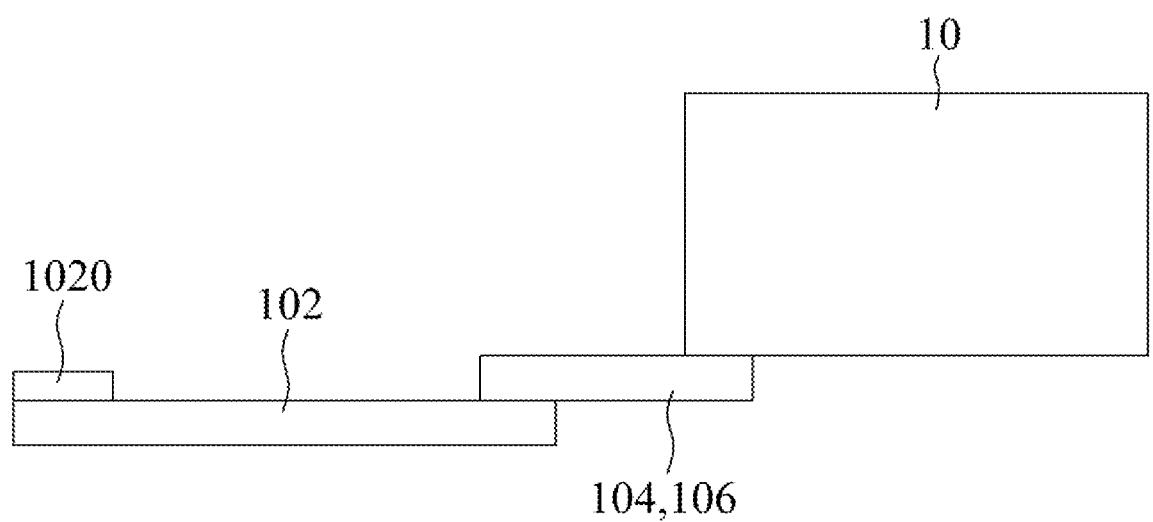
FIG. 2 is a structural side view of the liquid crystal touch control apparatus.

Please refer to FIG. 2. By using the soldering manner, the flexible printed circuit boards 104 and 106 are soldered to the flexible printed circuit board 102 for electrically connection, and after the signals are collected in the flexible printed circuit board 102, the collected signals are transmitted to the system through the connection terminal 1020. The system just needs to have the space for one port, thereby solving above problem.

Figure 3:
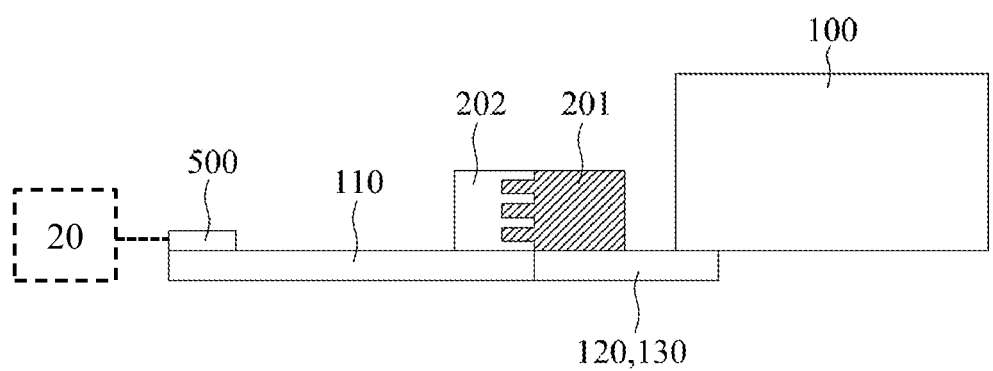
FIG. 3 is a structural side view of a display apparatus of an embodiment of the present disclosure.
Figure 6:
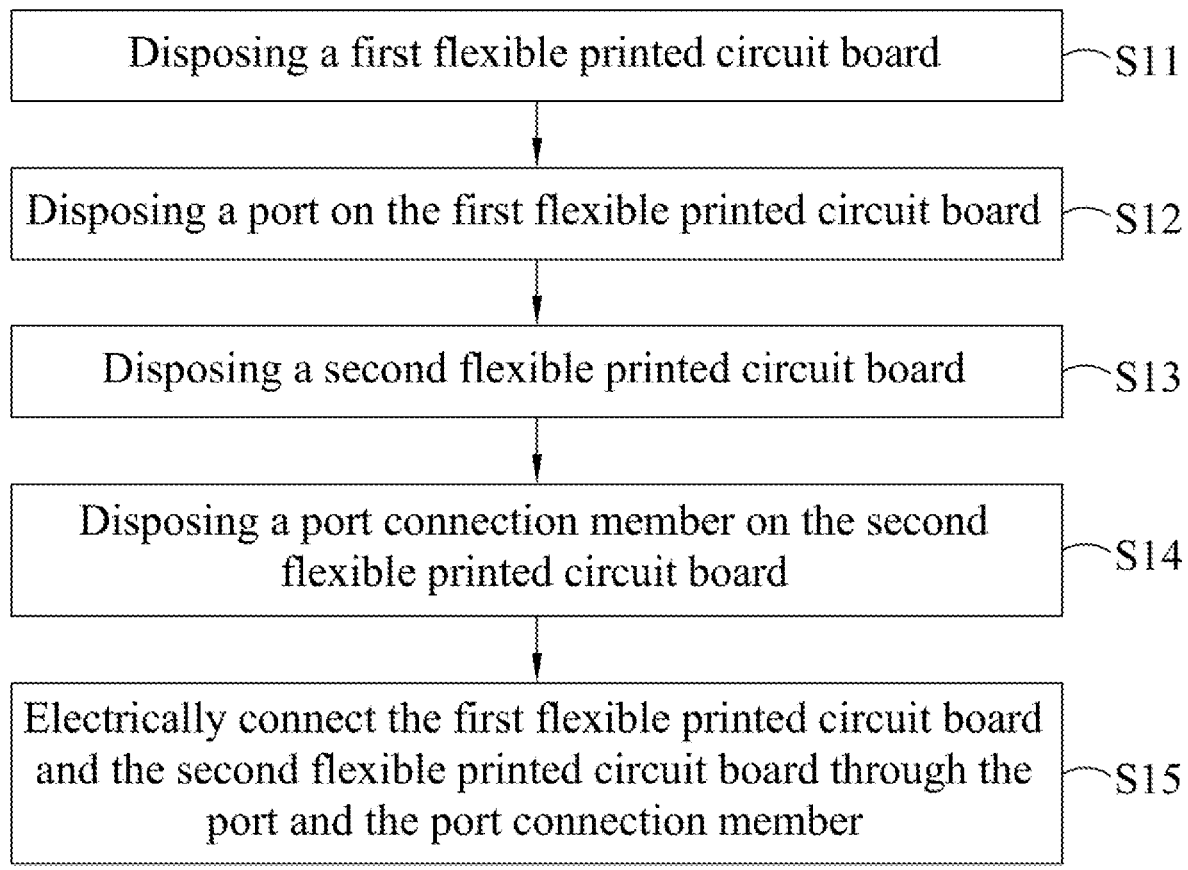
FIG. 6 is a flowchart showing the steps of manufacturing method of the signal transmission apparatus of an embodiment of the present disclosure.

In an embodiment, as shown in FIG. 3, a signal transmission device comprises a first flexible printed circuit board 110 and a second flexible printed circuit board 120. The first flexible printed circuit board 110 can be electrically connected to the display module 100 and the system 20, and the first flexible printed circuit board 110 includes a port 202 disposed thereon. The port 202 is electrically connected to the circuits of the first flexible printed circuit board 110, so that other components can be electrically connected to the first flexible printed circuit board 110 through the port 202. The second flexible printed circuit board 120 is electrically connected to the display module 100 and comprises a port connection member 201. The port connection member 201 is electrically connected to the circuits of the second flexible printed circuit board 120, so that other components can be electrically connected to the first flexible printed circuit board 110 through the port 202. The port connection members 201 and the port 202 corresponds to each other, and can be fixed together or detached from each other upon demand. The port connection member 201 can be inserted, engaged or connected to the port 202 by using spring clip, tenon, or other manner. The signal transmission device can be manufactured according to a flow shown in FIG. 6, and the descriptions for the steps S11 to S15 is merely for exemplary illustration, and the present disclosure is not limited thereto, and the manufacturing process can be modified upon demand.

In above embodiment, the port 202 can be single or multiple, and can be disposed at any side of the first flexible printed circuit board 110. For example, the port 202 can be disposed on an upper surface, a lower surface, an edge or other possible position of the first flexible printed circuit board 110. The disposal of the port 202 must ensure electrical connection between the port 202 and the first flexible printed circuit board 110, so as to input signal to or output signal from the first flexible printed circuit board 110 through the port 202.

On the other hand, the port connection member 201 can be single or multiple, and can be disposed at any side of the second flexible printed circuit board 120. For example, the port connection member 201 can be disposed on an upper surface, a lower surface, an edge or other possible position of the second flexible printed circuit board 120. The disposal of the port connection member 201 must ensure electrical connection between the port connection member 201 and the second flexible printed circuit board 120, so as to input signal to or output signal from the first flexible printed circuit board 110 through the port connection member 201.

The first flexible printed circuit board 110 can be electrically connected to the second flexible printed circuit board flexible printed circuit board through the port connection member 201 and the port 202. According to the positions of the port connection member 201 and the port 202, the first flexible printed circuit board 110 and the second flexible printed circuit board 120 can disposed in different positions. For example, the first flexible printed circuit board 110 and the second flexible printed circuit board 120 can be disposed on the same plane and adjacent to each other; or, the first flexible printed circuit board 110 and the second flexible printed circuit board 120 can be disposed on different planes; or, the first flexible printed circuit board 110 and the second flexible printed circuit board 120 can be overlapped partially. However, the actual positions of the first flexible printed circuit board 110 and the second flexible printed circuit board 120 are not limited to above examples, and any disposal of the first flexible printed circuit board 110 and the second flexible printed circuit board 120 for electrical connection is within scope of the present disclosure.

In an embodiment, the first flexible printed circuit board 110 can be directly connected to the display module 100, or not directly connected to the display module 100. Under a condition that the first flexible printed circuit board 110 is directly connected to the display module 100, the first flexible printed circuit board 110 can receive the signals from the display module 100 directly; and, under a condition that the first flexible printed circuit board 110 is not directly connected to the display module 100, the first flexible printed circuit board 110 can receive the signals from the display module 100 through the second flexible printed circuit board 120, the port connection member 201 and the port 202 which are electrically connected to the display module 10. Furthermore, the first flexible printed circuit board 110 can include a connection member 500 disposed thereon and configured to electrically connect the system, and the signal can be transmitted to the system through the connection member 500.

The second flexible printed circuit board 120 can be electrically connected to the light source or the touch panel of the display module 100 (not shown in figures), and transmits a light source signal provided by the light source, and/or transmits a touch control signal provided by the touch panel. The second flexible printed circuit board 120 and the first flexible printed circuit board 110 can be disposed on different sides of the display module 100, or, the second flexible printed circuit board 120 and the first flexible printed circuit board 110 can be disposed on the same side of the display module 100.

Optionally, the first flexible printed circuit board 110 and the second flexible printed circuit board 120 are fixed relative to each other through an alignment mark. Optionally, besides the port connection member 201 and the port 202, the first flexible printed circuit board 110 and the second flexible printed circuit board 102 can be connected with each other by other conventional manner after the first flexible printed circuit board 110 and the second flexible printed circuit board 102 are aligned with each other by the alignment mark, so as to fix their relative positions.

Furthermore, the signal transmission apparatus of the present disclosure may include a third flexible printed circuit board 130. The third flexible printed circuit board 130 can have a function equal to that of the second flexible printed circuit board 120. That is, the third flexible printed circuit board 130 can be electrically connected to the light source or the touch panel of the display module 100 (not shown in figures), and configured to transmit the light source signal provided by the light source, and/or transmit the touch control signal provided by the touch panel. Similarly, the third flexible printed circuit board 130 and the first flexible printed circuit board 110 can be disposed on different sides of the display module 100; or, the third flexible printed circuit board 130 and the first flexible printed circuit board 110 can be disposed on the same side of the display module 100. The third flexible printed circuit board 130 and the second flexible printed circuit board 120 can be disposed on different sides of the display module 100, or, the third flexible printed circuit board 130 and the second flexible printed circuit board 120 can be disposed on the same side of the display module 100.

Optionally, the third flexible printed circuit board 130 and the second flexible printed circuit board 120 can transmit different signals, respectively. For example, the third flexible printed circuit board 130 can be electrically connected to the light source of the display module 100 and transmit the light source signal, and the second flexible printed circuit board 120 can be electrically connected to the touch panel of the display module 100 and transmit the touch control signal.

In another embodiment of the present disclosure, the signal transmission apparatus can be disposed in the liquid crystal display apparatus to transmit signals, so as to provide a liquid crystal display apparatus of the present disclosure.

In some embodiments, the above-mentioned components can be optimized to improve advantages of the present disclosure upon actual condition and requirement. The following describes different embodiments.

Figure 4:
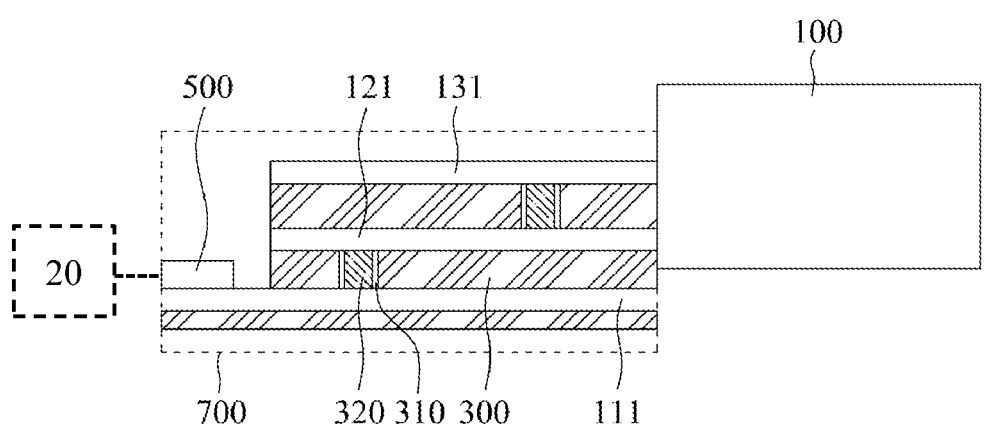
FIG. 4 is a structural side view of a display apparatus of an embodiment of the present disclosure.

According to an embodiment, the present disclosure provides a composite signal transmission apparatus. To optimize the disposal relationship between the first flexible printed circuit board 110, the second flexible printed circuit board 120 and the third flexible printed circuit board 130 without using the port connection members 201 and the ports 202 to electrically connect the flexible printed circuit boards, the first flexible printed circuit board 110, the second flexible printed circuit board 120 and the third flexible printed circuit board 130 are integrated as a composite signal transmission apparatus 700 with a multi-layer structure. As shown in FIG. 4, the flexible printed circuit boards equivalent to the first flexible printed circuit board 110, the second flexible printed circuit board 120 and the third flexible printed circuit board 130 are denoted as a first flexible printed circuit board 111, a second flexible printed circuit board 121 and a third flexible printed circuit board 131, so as to distinguish this embodiment from aforementioned embodiments. The first flexible printed circuit board 111, the second flexible printed circuit board 121 and the third flexible printed circuit board 131 are overlapped to form the composite signal transmission apparatus 700, and insulation layers 300 are disposed between the first flexible printed circuit board 111, the second flexible printed circuit board 121 and the third flexible printed circuit board 131, to form the multi-layer structure. Preferably, the insulation layer 300 can be formed with a plurality of through holes 310, and a plurality of conductive pillars 320 are disposed in the plurality of through holes 310, respectively, so that the first flexible printed circuit board 111, the second flexible printed circuit board 121 and the third flexible printed circuit board 131 can be separated from and electrically connected to each other. Optionally, the first flexible printed circuit board 110 can be replaced by a hard circuit board. Furthermore, the insulation layer 300 can be disposed under the first flexible printed circuit board 111.

For example, the material of the insulation layer 300 can be polyimide (PI), polyethylene terephthalate (PET), polyethylene naphthalate (PEN) or other insulation material known in the art. The material of the conductive pillar 320 can be conductive adhesive, isotropic conductive film, or conductive material known in the art:

For example, the second flexible printed circuit board 121 can be electrically connected to the light source of the display module 100, and the third flexible printed circuit board 131 can be electrically connected to the touch panel of the display module 100. The second flexible printed circuit board 121 and the third flexible printed circuit board 131 can be electrically connected to the first flexible printed circuit board 111 through the conductive pillars 320 in the through holes 310, and then electrically connected to the system through the connection member 500. However, above-mentioned description is merely for exemplary illustration, and the actual disposal of the printed circuit boards can be adjusted upon demand. For example, the second flexible printed circuit board 121 and the third flexible printed circuit board 131 can be disposed on the same plane of the first flexible printed circuit board 111, and electrically connected to the first flexible printed circuit board 111 by above-mentioned manner.

Figure 5:
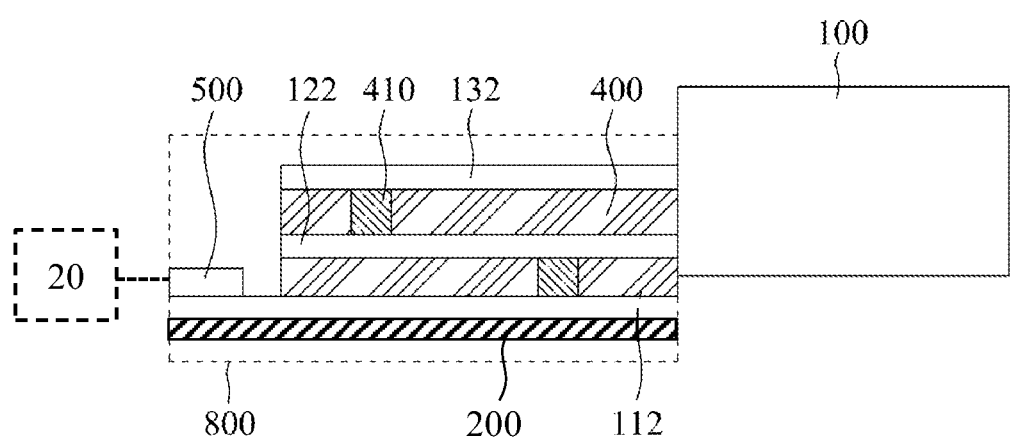
FIG. 5 is a structural side view of display apparatus of an embodiment of the present disclosure.

Similarly, in another embodiment, the disposal relationships between the first flexible printed circuit board 110, the second flexible printed circuit board 120 and the third flexible printed circuit board 130 can be optimized. The first flexible printed circuit board 110, the second flexible printed circuit board 120 and the third flexible printed circuit board 130 are integrated as a composite flexible printed circuit board with a multi-layer structure similar to previous embodiment, so as to form a compact composite signal transmission device 800, as shown in FIG. 5. In FIG. 5, the compact composite signal transmission device 800 includes a first conductive pattern 112, a second conductive pattern 122, and a third conductive pattern 132 equivalent to circuits on the first flexible printed circuit board 110, the second flexible printed circuit board 120 and the third flexible printed circuit board 130, respectively. The first conductive pattern 112 can be disposed on any insulation substrate 200, and the insulation substrate 200 includes a conductive part 500 disposed thereon and electrically connected to the above-mentioned structures.

Figure 7:
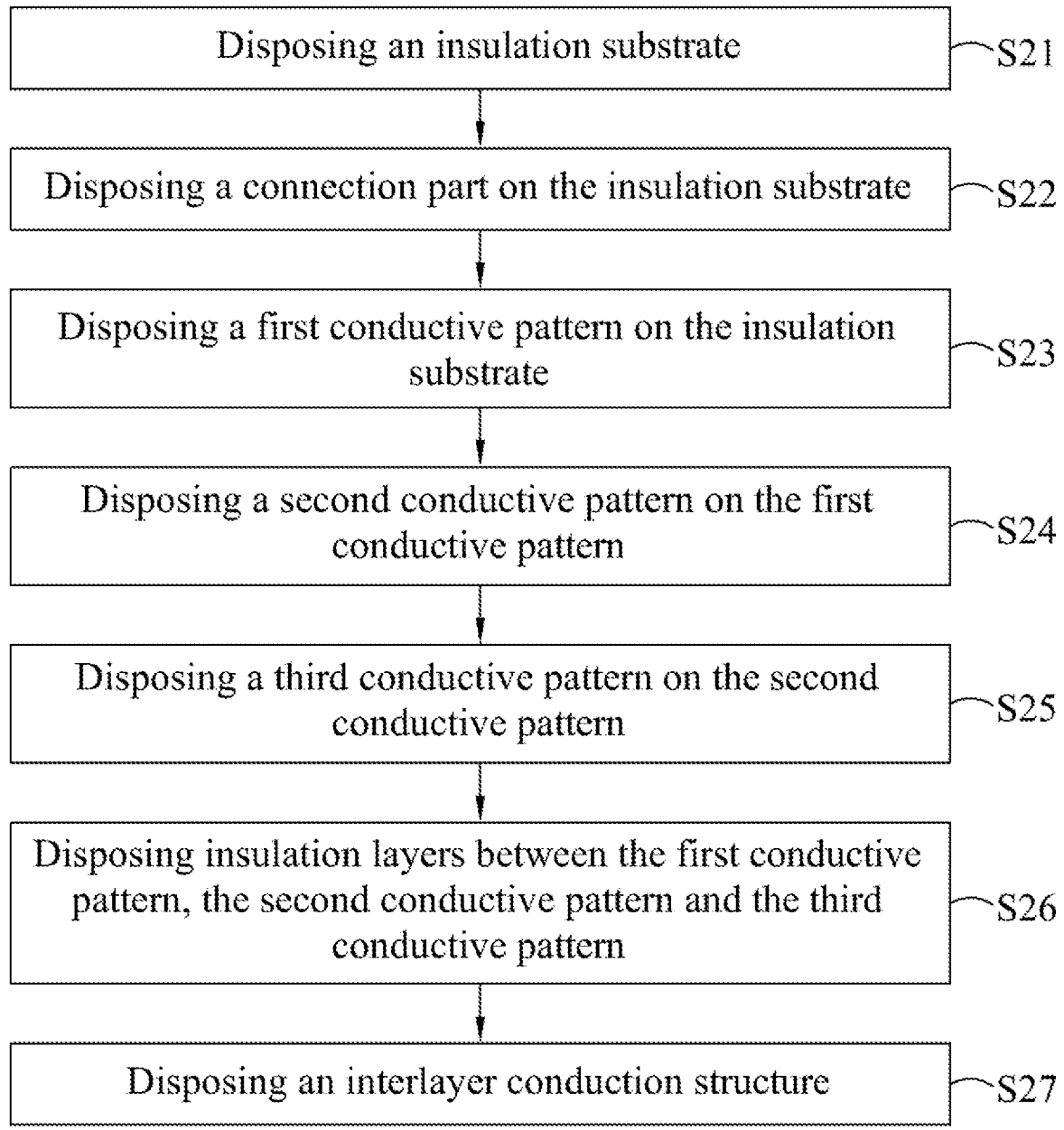
FIG. 7 is a flowchart showing the steps of manufacturing method of the signal transmission apparatus of other embodiment of the present disclosure.

Insulating layers 400 are disposed under a bottom of the compact composite signal transmission apparatus 800, and disposed between the first conductive pattern 112, the second conductive pattern 122 and the third conductive pattern 132, respectively. The interlayer conduction structure 410 is disposed between the first conductive pattern 112, the second conductive pattern 122 and the third conductive pattern 132, so that the first conductive pattern 112, the second conductive pattern 122 and the third conductive pattern 132 can be electrically connected to each other through the interlayer conduction structure 410. In order to form the interlayer conduction structure 410, the insulation layer 400 can be formed with at least one through hole, and an inner wall of the through hole can be coated with conductive layer by chemical and plating process. The material of the coating layer can be metal or conductive plastic, or other conductive material. The coating layer is electrically connected to conductive patterns over and under the interlayer conduction structure, so as to electrically connect to the conductive patterns. The signal transmission apparatus with the insulating layers 400 can be manufactured according to a flow shown in FIG. 7, and the descriptions for the steps S21 to S27 is merely for exemplary illustration, and the present disclosure is not limited thereto, and the manufacturing process can be modified upon demand.

The different between the compact composite signal transmission apparatus 800 and the composite signal transmission apparatus 700 of previous embodiment is that the first conductive pattern 112, the second conductive pattern 122 and the third conductive pattern 132 are formed by copper foil stamping manner. The first conductive pattern 112, the second conductive pattern 122 and the third conductive pattern 132 are much thinner than the first flexible printed circuit board 111, the second flexible printed circuit board 121 and the third flexible printed circuit board 131, so that the entire thickness of the compact composite signal transmission apparatus 800 can be lower than that of the composite signal transmission apparatus 700.

Furthermore, the insulation layer 400 of the compact composite signal transmission apparatus 800 can be made by single material, but the insulation layer 400 has two states during the forming process, one of the two states is solid insulation layer, and the other is liquid insulation layer before solidification. Preferably, the material of the insulation layer 400 can be polyimide (PI). The insulation layer 400 is disposed between the first conductive pattern 112, the second conductive pattern 122 and the third conductive pattern 132. The prepolymer solution of the liquid polyimide is coated between the three conductive patterns first. The prepolymer solution is the material of the insulation layer 400 before solidification. Next, the solution is heated to remove the organic solvent in the solution, so as to solidify the material to form the insulation layer 400. The insulation layer 400 has insulation effect and can also be served as assistant adhesive material for the first conductive pattern 112, the second conductive pattern 122 and the third conductive pattern 132, so as to make the structure of the compact composite signal transmission apparatus 800 more stable.

Similarly, in the present disclosure, above-mentioned signal transmission apparatus can be disposed in the liquid crystal display apparatus to transmit signals, so as to provide the liquid crystal display apparatus of the present disclosure having benefits and effects of above-mentioned embodiments. Without affecting the signal transmission of the circuit board, the disposal of the circuit board of the liquid crystal display apparatus can be changed to reduce the ports electrically connected to the system, thereby omitting the soldering process having higher variation, and reducing errors and increasing product yield.

Besides the display apparatus, the signal transmission apparatus of the present disclosure can also be disposed in other electronic apparatus. Preferably, the signal transmission apparatus can be applied to LCD display apparatus, OLED display apparatus, Q LED display apparatus, curved display apparatus or other display apparatus.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:
1. A signal transmission device, comprising:
a first flexible printed circuit board electrically connected to a display module and a system, and comprising a port; and
a second flexible printed circuit board electrically connected to the display module, and comprising a port connection member, wherein the port connection member corresponds to the port;
wherein the second flexible printed circuit board is electrically connected to the first flexible printed circuit board through the port connection member and the port, and is further electrically connected to the systems;
wherein the port is disposed at an edge of the first flexible printed circuit board and the port connection member is disposed at an edge of the second flexible printed circuit board, and when the port connection member is coupled to the port, the edge of the first flexible printed circuit board and the edge of the second flexible printed circuit board are in contact with each other.

2. The signal transmission device according to claim 1, wherein the second flexible printed circuit board is configured to transmit a light source signal, or a touch control signal, or both of the light source signal and the touch control signal.

3. The signal transmission device according to claim 1, wherein the first flexible printed circuit board and the second flexible printed circuit board are fixed relative to each other.

4. The signal transmission device according to claim 1, further comprising a third flexible printed circuit board.

5. The signal transmission device according to claim 4, wherein the first flexible printed circuit board and the second flexible printed circuit board are fixed relative to each other, and the first flexible printed circuit board and the third flexible printed circuit board are fixed relative to each other.

6. A display device, comprising:
a display module; and
a system;
wherein the display module and the system are electrically connected to each other through a signal transmission device, and the signal transmission device comprises:
a first flexible printed circuit board electrically connected to the display module and the system, and comprising a port; and
a second flexible printed circuit board electrically connected to the display module, and comprising a port connection member, wherein the port connection member corresponds to the port;
wherein the second flexible printed circuit board is electrically connected to the first flexible printed circuit board through the port connection member and the port, and is further electrically connected to the system;
wherein the port is disposed at an edge of the first flexible printed circuit board and the port connection member is disposed at an edge of the second flexible printed circuit board, and when the port connection member is coupled to the port, the edge of the first flexible printed circuit board and the edge of the second flexible printed circuit board are in contact with each other.

7. The display device according to claim 6, wherein the second flexible printed circuit board is configured to transmit a light source signal.

8. The display device according to claim 6, wherein the second flexible printed circuit board is configured to transmit a touch control signal.

9. The display device according to claim 6, wherein the second flexible printed circuit board is configured to transmit a light source signal and a touch control signal.

10. The display device according to claim 6, wherein the first flexible printed circuit board and the second flexible printed circuit board are fixed relative to each other.

11. The display device according to claim 6, further comprising a third flexible printed circuit board.

12. The display device according to claim 11, wherein the first flexible printed circuit board and the third flexible printed circuit board are fixed relative to each other.

13. The display device according to claim 11, wherein the first flexible printed circuit board and the second flexible printed circuit board are fixed relative to each other, and the first flexible printed circuit board and the third flexible printed circuit board are fixed relative to each other.

14. A display device, comprising:
a display module; and
a system;
wherein the display module and the system are electrically connected to each other through a signal transmission device, and the signal transmission device comprises:
a first flexible printed circuit board electrically connected to the display module and the system, and comprising a port; and
a second flexible printed circuit board electrically connected to the display module, and comprising a port connection member corresponding to the port, and electrically connected to the first flexible printed circuit board through the port connection member and the port;
a third flexible printed circuit board electrically connected to the display module, and comprising at least one other port connection member;
wherein the second flexible printed circuit board is configured to transmit a light source signal, a touch control signal or both, and the first flexible printed circuit board and the second flexible printed circuit board are fixed relative to each other, and the first flexible printed circuit board and the third flexible printed circuit board are fixed relative to each other;
wherein the port is disposed at an edge of the first flexible printed circuit board and the port connection member is disposed at an edge of the second flexible printed circuit board, and when the port connection member is coupled to the port, the edge of the first flexible printed circuit board and the edge of the second flexible printed circuit board are in contact with each other.

15. A signal transmission apparatus, comprising:
an insulation substrate;
a connection member disposed on the insulation substrate and electrically connected to a system;
a first conductive pattern disposed on the insulation substrate, and electrically connected to a display module and the connection member;
a second conductive pattern disposed on the first conductive pattern, and electrically connected to the display module and the first conductive pattern;
a third conductive pattern disposed on the second conductive pattern, and electrically connected to the display module and the second conductive pattern;
insulation layers disposed between the first conductive pattern, the second conductive pattern and the third conductive pattern, respectively, and configured to insulate and attach the first conductive pattern, the second conductive pattern and the third conductive pattern;
an interlayer conduction structure disposed in the insulation layers, wherein the second conductive pattern and the third conductive pattern are electrically connected to the system through the first conductive pattern through the interlayer conduction structure;
wherein the second conductive pattern and the third conductive pattern are both in direct connection with the display module, and signals on the third conductive pattern are transmitted to the second conductive pattern via a first interlayer conduction structure, and then transmitted from the second conductive pattern to the first conductive pattern via a second interlayer conduction structure in order to establish communication between the display module and the system.

16. The signal transmission apparatus according to claim 15, wherein the interlayer conduction structure comprises through hole formed in the insulation layer in vertical direction.

17. The signal transmission apparatus according to claim 16, wherein an inner wall of the through hole is coated with conductive layer.

18. The signal transmission apparatus according to claim 17, wherein the insulating layer and the first conductive pattern and the second conductive pattern are attached with each other by solidifying prepolymer solution.

\* \* \* \* \*